United States Patent Office 2,712,996

Patented July 12, 1955

2,712,996

PHOTOGRAPHIC PROCESS USING A LIGHT SENSITIVE RESIN COMPOSITION

Stanley B. Elliott, Shaker Heights, Ohio, assignor to Ferro Corporation, Cleveland, Ohio, a corporation of Ohio No Drawing. Application December 10, 1952, Serial No. 325,207

7 Claims. (Cl. 95—7)

The present invention is a continuation-in-part of my application Serial Number 127,517, filed November 15, 1949, now abandoned.

This invention relates as indicated to a new composition of matter and has more particular reference to photosensitive resins compositions and method of making same.

Although the art of photosensitive compositions capable of producing images is old, heretofore, a photosensitive halogenated resin system has never been made which produces a visible or immediate image upon exposure to an actinic light source.

It is therefore a principal object of this invention to provide a new composition of matter comprising a photosensitive resin system capable of producing immediate visible images upon exposure to actinic light.

Another object of this invention is to provide a photosensitive layer which can be "developed" and "fixed" without the aid of external chemicals.

A further object of this invention is to provide a photosensitive layer which can be "developed" and "fixed" by light and heat alone.

Other objects will appear as the description proceeds.

To the accomplishment of the foregoing and related ends the invention then, comprises the features hereinafter fully described and pointed out in the claims, the following description setting forth in detail certain illustrative embodiments of the invention, these being indicative, however of but a few ways in which the principle of the invention may be employed.

Broadly stated this invention comprises a new composition of matter consisting essentially of an intimate admixture of:

(*a*) A halogenated vinylog polymer resin capable of dehydrohalogenation with the formation of at least 5 conjugated double bonds per molecule;

(*b*) A minor amount of a metal hydrogen-halide sequestering agent which agent in the presence of actinic light is raised to such an energy level so as to be capable of catalyzing the removal by chain reaction at least 5 hydrogen-halide from said resin, and which agent in the absence of actinic light and in the presence of heat is capable of reaching an energy level only high enough to remove less than 5 hydrogen-halide from said resin; and (*c*) A minor amount of a compound which at the temperature necessary, in the absence of light, to cause dehydrohalogenation of said resin will make available organic groups to satisfy the double bonds formed by such heat caused dehydrohalogenation.

It is well known to those skilled in the art that the formation of images in photosensitive compositions is dependent upon the degeneration of the silver salts therein. I have found that various halogenated resins can be degenerated to form their own chromophore groups. Therefore in the photosensitive system of my invention the formation of images is not dependent per se upon the degeneration of silver salts as in the prior art, but is dependent upon the degradation of a halogenated resin to form a molecule containing five or more conjugated double bonds. I have found that in order for the compositions of my invention to be photosensitive certain conditions must be met. First, the halogenated resin must not only be capable of dehydrohalogenation, but the resin must be able to undergo the type of dehydrohalogenation wherein at least 5 conjugated double bonds and preferably 10 or more double bonds are formed on each molecule. This is necessary since I have found that if less than 5 conjugated double bonds, per molecule are formed there are an insufficient amount of chromophore groups formed and consequently no image is obtained. Second, the metal hydrogen-halide sequestering agent used, must of necessity be of the type which in the presence of actinic light reaches an energy level high enough to catalyze the removal by chain reaction of at least 5 hydrogen-halide from the above mentioned resin. However, this sequestering agent in the absence of actinic light and in the presence of heat must only reach an energy level wherein it causes the removal of less than 5 hydrogen-halide from the halogenated resin. In other words the sequestering agents usable in the present invention must be highly reactive in actinic light and of a much lower order of activity in the presence of heat. Third, since the sequestering agent of the present invention does tend to remove some hydrogen-halide in the presence of heat, there is a tendency towards discoloration, therefore a compound is used in the compositions of this invention which in the presence of heat will make available organic groups to satisfy the double bonds formed by such heat caused dehydrohalogenation.

Since my compositions of matter and processes for making them are different than ordinarily encountered by those skilled in the art the following definitions are offered so as to avoid any confusion that might arise:

Cure: Is the time necessary to obtain solvation of the resin film so that it can be handled;

Exposure: Is the treatment of the photosensitive layer under an actinic light source to produce an image;

Image: Is the area purposely developed by exposure to a suitable actinic light source;

Ground: Is the undeveloped area around the image;

Fix: Is the heat treatment of the exposed photosensitive layer so as to desensitize the ground;

Weathering: Is the test of effects of sunlight after the fix;

Modifiers: All compounds added to the photosensitive system in the presence of the unsaturation agent, which may affect color, intensity or depth of the image on exposure:

Metal hydrogen-halide sequestering agents: Are compounds which in the presence of actinic light reaches an energy level wherein they are capable of catalyzing the removal by chain reaction of at least 5 hydrogen-halide per molecule of resin and in the absence of actinic light and in the presence of heat reach an energy level only high enough to remove less than 5 hydrogen-halide per molecule of resin.

Various photothermographic compositions are known. That is photosensitive compositions that depend upon light and heat for "developing" and "fixing." Such compounds as described in United States Patent 1,976,302 are of the photothermographic type, however, they are not to be confused with the photosensitive compositions of the present invention. When the compositions of the former type are exposed to light a latent image is formed whereas when the compositions of the present invention are exposed to light an immediate visible image is formed. Further, the compositions of the prior art are dependent entirely on the degeneration of their silver salts to form images whereas the compositions of the present invention form images by the degeneration of the halogenated resin.

In the foregoing broad statement of my invention the basic component of the composition has been defined as a halogenated resin capable of dehydrohalogenation with the formation of at least 5 conjugated double bonds per molecule. The compounds which may be used for this purpose must:

(*a*) Have a sufficiently high molecular weight so as to be resinous in character;

(*b*) They must be substantially straight-chain; and (*c*) They must contain halogen.

In further explanation of the above, it should be noted that whereas there are found in their natural state as in petroleum straight-chain organic compounds, there are none which in their natural state have a sufficiently high molecular weight so as to be resinous and possess the physical properties required of the basic material of my product. It is accordingly necessary to form such compounds and this is done by the polymerization of relatively low molecular weight compounds and because of its activity ethylene is the source of most of such polymers. The sufficiently high molecular weight material may thus be produced by polymerizing ethylene and since the resultant product should contain replaceable halogen, it is convenient to begin with a halogen containing material such as vinyl chloride. It is of course possible also to form a comparable and useable molecule by the polymerization of ethylene to produce a polyethylene of sufficiently high molecular weight which may then be chlorinated; however, this route is not recommended because ethylene containing no chlorine, being less active than vinyl chloride, requires extremely drastic conditions in order to effect polymerization. Pressures on the order of more than 1,000 atmospheres and appropriate catalysts being needed in addition to high temperatures in order to produce the unchlorinated polyethylene.

Instead of using only the homo-polymer of ethylene chloride or vinyl chloride, other polymers may be used which will produce equivalent structures. Thus, for example, in addition to vinyl chloride homopolymers I may use a vinylidene chloride homopolymer as well as co-polymers of vinyl chloride and vinylidene chloride. The presence of other groups such as ester groups which do not interfere with dehydrohalogenation is not objectionable so that I may use also co-polymers of vinyl chloride for example with vinyl acetate.

The compound used as the basic material which for the reasons explained above is for practical purposes a polymer must contain a straight-chain of substantial length in the molecule so that upon dehydrohalogenation the molecule will contain at least 5 and preferably 10 or more conjugated double bonds. This requirement is met admirably by the vinyl chloride polymers and co-polymers referred to above as well as halogenated polyethylene. For convenience in the identification of this class of materials, I may resort to the term vinylogs as defined by R. S. Fuson in his "The Principals of Vinylogy," Chemical Review 16, 1 (1935). The materials which are thus useful as the basic material of my product may be defined as polymers of vinylogous series which contain a straight-chain of at least 5 and preferably 10 or more carbon atoms and which are halogenated to the extent so that upon dehydrohalogenation they will yield substituent groups having 5 and preferably 10 or more conjugated double bonds. Stated in another way, the basic materials used in the production of my new product are halogenated vinylogous resins. These resins all have the property of degrading by means of dehydrohalogenation when exposed to heat and/or light. If held at room temperature and without the presence therein of a stabilizer, they will degrade in color but at a relatively slow rate. If subjected to actinic light and/or heat such rate of degradation is moderately accelerated. However, these resins when intimately admixed with component (*b*), as defined in the aforementioned broad statement, and then subjected to actinic light undergo rapid dehydrohalogenation.

In the broad statement of the invention, component (*b*) has been defined as a metal hydrogen-halide sequestering agent which in the presence of actinic light is raised to such an energy level as to promote the dehydrohalogenation of the basic material to the extent that at least 5 and preferably 10 or more conjugated double bonds are formed. The products which are used for this purpose are not required in an amount stoichiometrically to combine with the hydrogen-halide released from the basic material during dehydrohalogenation. Consequently, this material component (*b*) or its degradation products serve catalytically to promote the dehydrohalogenation of the basic material. The compounds which have been found to be particularly useful for this purpose are certain photosensitive silver salts since the ultimate product of my invention is to be used for the purpose of reproducing an image which is projected onto the product by actinic light. In this case therefore the employment of a component (*b*) material which is photosensitive and thus reaches an energy level effective to catalyze the dehydrohalogenation by chain reaction of the basic material are best suited for this purpose. The compounds useful as component (*b*) may be defined therefore as those compounds which upon being subjected to actinic light will form a material which catalyzes the dehydrohalogenated basic material. Thus far we have referred to the effect of actinic light on the component (*b*) material and in effect it has been stated that the exposure of the material to actinic light raises its energy level to the point where it promotes by chain reaction the dehydrohalogenation of the basic material to the extent necessary to form at least 5 and preferably 10 or more conjugated double bonds. The energy level of most compounds is usually raised by an increase in temperature. The compounds selected for use as component (*b*) must be such that by raising its temperature to as high as 350° F., its level of activity will still be so low as not to promote the dehydrohalogenation of the basic material to the extent necessary to form at least 5 conjugated double bonds.

Specific examples of resins useful in the photosensitive systems of the present invention are as follows:

Vinyl chloride polymers
Vinyl chloride-vinyl acetate copolymers
Vinylidene chloride polymers
Vinyl chloride-vinylidene chloride copolymers However, it is entirely within the contemplation of this invention to use any halogenated resin capable of dehydrohalogenation resulting in the formation of five or more conjugated double bonds. In addition I have also found that if such groups as $NR_2$, NHR, $NH_2$, OH and $OCH_3$ known to possess auxochromic activity in the presence of conjugated double bonds, are substituted in the resin molecule in place of hydrogen on the carbon next to that carbon carrying the chlorine, a more intense image may be obtained on exposure of the system to actinic light.

The metal hydrogen-halide sequestering agents used in the compositions of the present invention may be any organic or inorganic compound which reacts in the presence of light and heat as above discussed. I have found that such compounds as silver carbonate, silver oxide, silver phosphate and thallium fluoride when properly incorporated with the resins used in the present invention will cause the removal by chain reaction of hydrogen-halide to form at least 5 conjugated double bonds per molecule of the discussed resins. However, in the preferred embodiment of my invention I use organic silver compounds. Thus I prefer the use of silver compounds of organic acids, phenols, mercaptans. Such compounds as silver naphthenate, silver acetate, silver stearate, silver cumate, silver octoate and the silver salt of 2 hydroxy 1, 4, naphthoquinone are typical examples of the preferred compounds.

As for the silver concentration necesary, the sequestering agent may vary over a range of concentration which will give ratios of silver to resin ranging from 1:500 to 1:50. For a given condition of exposure, the optical density increases with increase in silver concentration.

In order for the photosensitive systems of my invention to function, it is necessary that the metal hydrogen-halide sequestering agent be thoroughly distributed throughout the system in a uniform manner. Several possible methods of accomplishing this are as follows:

(*a*) If the sequestering agent is soluble in the system, it may be added directly to the other components and mixed by mechanical agitation.

(*b*) The sequestering agent may be dissolved in any suitable liquid. The resin may then be added to this solution, mixed thoroughly and the solvent evaporated, leaving the resin uniformly coated with the sequestering agent. Resins so treated may then be used in paste formulations from which films are prepared.

(*c*) If the sequestering agent is insoluble in all the components of the system, it is practical to mix and mull the entire formulation on a 3 roll paint mill or other similar milling equipment.

(*d*) If the sequestering agent is insoluble and it is not practical to carry out the method described in (*c*) then the sequestering agent may be made soluble by peptizing and then handled as in (*a*).

(*e*) In addition to the aforegoing methods of incorporating a sequestering agent with a halogenated resin, a film can be made and the sequestering agent deposited on the surface thereof and allowed to soak down into the film thus allowing the sequestering agent to come into intimate contact with the particles of the resin and thus form a photosensitive film.

In the case of (*a*) above silver naphthenate may be used as the sequestering agent, since it will readily disperse directly into the system with simple mixing. An example of case (*b*) above silver acetate solution may be admixed with the resin. After drying, the resin may then be treated with plasticizer and stabilizer to form a paste from which a film may be drawn down. Silver stearate may be handled as in (*c*) above or it may be peptized with an excess of naphthenic acid and used in the manner as disclosed in (*d*) above. As for (*e*) above, a plastisol may be prepared by mixing polyvinyl chloride resin and dioctyl phthalate. A film is then drawn down from this mixture and allowed to air dry. A mixture comprising:

5 grams silver naphthenate
5 grams dibutyl tin dinaphthenate
50 grams solvent is then applied to the surface of the above mentioned film. The film being air dried and therefore not fused has a "blotter" effect and allows the unsaturation agent and stabilizer to soak down into the film. A photosensitive system made in this manner when exposed to actinic light under a negative produces an immediate image.

Thus, regardless of the method used, it is only necessary that the sequestering agent be uniformly and completely dispersed throughout the system in order to make the system photosensitive.

So that the present invention will be more readily understood the following examples are given:

I 50 grams vinyl chloride-vinylidene copolymer resin
25 grams solvent
12 grams dioctyl phthalate
3 grams dibutyl tin dilaurate
1 gram silver naphthenate The above ingredients were thoroughly mixed, and then poured onto a plate and a 4 mil film drawn down. The film was then cured at about 350° F. for about 1 minute. Although a cure time is not essential to the mechanism of the invention I cure the film so that it will not be sticky, and thus facilitate handling. The film was then masked with a negative and exposed to actinic light for about 10 minutes. An immediate image was formed and was fixed at 350° F. for about 15 minutes. The resultant image was then allowed to weather for 5 days. At the end of this time there was no change in the intensity of the image to the ground.

The exposure of the photosensitive vinyl films of this invention may be carried out under any source of actinic light. The time of exposure necessary to form an image will vary with (*a*) the density of the image desired (*b*) the intensity of the light source and (*c*) the ratio of silver to resin in the system. To obtain images of low optical density as little as 10 seconds' exposure is necessary under a light source with an energy out-put such that the sensitized surface being exposed receives 120 milliwatts per square centimeter. On the other hand, exposure to sunlight for 10 minutes gives images of fair optical density. In general, the image density increases with time of exposure.

The fixing operation, or desensitizing of the ground, is normally carried out at the temperatures recommended by the resin manufacturers for the processing of the vinyl film and as normally used by the vinyl trade. These temperatures range from 250° F. to 450° F. applied over a period of from 1 to 30 minutes.

The same procedure as discussed in Example I above was repeated using different resins, such as, vinyl chloride ester copolymer resin, polyvinyl chloride resin, polyvinylidene chloride resin, etc. All of these resins worked in the presence of the silver naphthenate.

II 50 grams vinyl chloride-vinylidene chloride resin
30 grams solvent
21 grams dioctyl phthalate
3 grams dibutyl tin dilaurate
2 grams silver cumate peptized with naphthenic acid A film was made and treated as in Example I with the same results noted.

The same formulation was also repeated using different resins, as noted above. All of the resins worked in the presence of the silver cumate peptized with naphthenic acid.

III 50 grams vinyl-chloride-vinylidene chloride resin
30 grams solvent
21 grams dioctyl phthalate
4 grams silver octoate peptized with octoic acid
3 grams dibutyl tin dilaurate A film was made and treated as in Examples I and II with same results noted except that the image was reddish brown in color instead of dark orange.

The same formulation was repeated except different resins as noted above were used. All of the resins worked in the presence of the silver octoate peptized with octoic acid.

While I prefer to use dibutyl tin dilaurate, dibutyl tin dinaphthenate of other salts of dibutyl tin oxide because of their superior stabilizing ability, it is possible and entirely within the contemplation of the present invention to use any of the numerous compounds which are used as stabilizers for vinyl chloride polymers and/or copolymers. The following examples of compounds were used in the photosensitive systems of this invention and were found to function satisfactorily.

| | |
|---|---|
| Dibutyl tin maleate | Phenol |
| Dibutyl tin diacetate | Lead tartrate |
| Dibutyl tin alkyl phosphate | Tributyl borate |
| Dibutyl tin dinaphthenate | Ethyl silicate |
| Dibutyl tin octolate | Thiodipropionitrile |
| Tetra butyl tin | Triphenyl borate |
| Triphenyl phosphite | Propyl acid maleate |

Nopol acid maleate
Dibutyl maleate
Ethyl methacrylate
Lauryl methacrylate
Crotonic acid While these aforementioned substances may function as heat and light stabilizers in normal vinyl systems, I am interested primarily in their heat stabilizing action. The stabilizer concentration may vary from a stabilizer-resin ratio of 1:500 to 1:50, depending on the stabilizer activity and the stability desired in the ground. While the stabilizer to resin ratio may vary widely as indicated above, a stabilizer is a necessary part of my photosensitive system to prevent degradation and maintain a contrast between the image and the ground.

As for the plasticizers, while I prefer to use dioctyl phthalate in the photosensitive systems of the present invention, a wide choice of plasticizers or mixtures of plasticizers is possible. The choice is substantially dependent upon the physical properties desired in the final film. The following materials are typical examples of plasticizers which I may use:

Dioctyl phthalate
Tricresyl phosphate
Tributyl Cellosolve phosphate
Triethylene glycol di, 2-ethyl hexoate
Di, 2-ethylhexyl adipate The amount of plasticizer may vary from 0 to about 70 parts per 50 parts of resin depending upon the solubility characteristics of the resin, the type of plasticizer and the type of film desired. The following examples illustrate the extreme variation of plasticizer usable in the present invention.

IV 50 grams polyvinyl chloride resin
50 grams solvent
0 grams plasticizer (dioctyl phthalate)
4 grams unsaturation agent (silver naphthenate, 4.5% Ag)
3 grams stabilizer

V 50 grams polyvinyl chloride resin
10 grams solvent
70 grams plasticizer (dioctyl phthalate)
4 grams unsaturation agent (silver naphthenate, 4.5% Ag)
3 grams stabilizer In the case of Example IV, good image formation was obtained, though a very dry brittle film was obtained. In Example V above, good image was obtained and the film was very soft and pliable.

The photosensitive systems of this invention can be further modified by the addition of (*a*) agents which increase image density, (*b*) pigments and (*c*) agents for increasing light sensitivity. (*a*) Guanidine naphthenate in combination with the silver unsaturation agents will give increased image density on exposure to actinic light. With a resin weight of 50 grams, amounts of guanidine naphthenate varying from 0.10 gram to 10.0 grams results in increased image density. Silver salts, such as, 2-hydroxy-1, 4-naphthoquinone, may be used as the unsaturation agent or in conjunction with another unsaturation agent so that as silver chloride is formed, the free alkyl group may anchor along the resin chain to act as an auxochromic group in the presence of the polyene groups formed by the unsaturation agent. (*b*) The pigments can be divided into two broad classes as they effect the product of this invention. The one class of pigments are those that just add color, such as Zulu green, Zulu blue, malachite green, erythrosene, etc. and the other class are those pigments which add color and at the same time cause the resin film to be opaque. Such substances as aluminum powder, copper powder, antimony oxide, lead carbonate, etc. are examples of the latter type of pigment. These latter types of pigments can also be used to make "sandwich" type films. That is, the bottom film or undercoat is a non-photosensitive layer made opaque by finely divided aluminum powder. Over this is deposited a photosensitive layer or overcoat containing little or no pigment. Thus the high light reflectance of the undercoat causes a clear refined image. If desired along with pigmentation, flattening agents can be used to give a nonspecular surface. (*c*) As for the sensitizing agents I have found that small amounts of Rhodamine B when added to the photosensitive resin makes a composition which is characterized by greater sensitivity to light. Also certain amine and sulfur compounds such as diamylamine, dioctylamine, diamylsulfide and dimethylsulfolane cause increased darkening of the light exposed areas of a film without substantially darkening the unexposed areas. Increased sensitivity to light may also be obtained by the use of agents possessing high absorbency of actinic light. For example, tall oil and tall oil esters which have high absorbency of actinic light have increased the density of images obtained in the photosensitive films of this invention.

If desired the photosensitive resins of this invention can be made into films wherein the image is colorless and the ground area is darkened. By adding 4% benzoyl peroxide in any of the aforementioned examples a film can be obtained in which the image is colorless. During fixing the peroxide appears to react with the polyunsaturates (chromophoric groups) of the image area and bleach them. Upon further heating the peroxide concentration drops off because of thermal decomposition and chromophoric groups develop in the ground area because the silver unsaturation agent there is unconsumed, not having been light exposed, and so it is present to cause thermal dehydrohalogenation. The heating period is stopped when adequate color has developed in the ground and before the small concentration of unsaturation remaining in the image area has an opportunity to produce further chromophoric groups.

Other modes of applying the principle of the invention may be employed provided the features stated in any of the following claims or the equivalent of such be employed.

I, therefore, particularly point out and claim as my invention:

1. The process of making photographic images which comprises selectively exposing a masked photo-sensitive film for at least 10 seconds to an actinic light source having an energy output of at least 120 milliwatts per square centimeter of exposed surface, said film consisting essentially of an intimate admixture of: (*a*) a substantially straight chain organic halogenated vinyl polymer resin, said resin capable of dehydrohalogenation with the formation of at least 5 conjugated double bonds; (*b*) a sequestering agent selected from the class consisting of silver carbonate, silver oxide, silver phosphate, silver naphthenate, silver acetate, silver cumate, silver octoate, silver compounds of phenols, silver compounds of mercaptans and the silver salt of 2 hydroxy 1, 4, naphthoquinone; and (*c*) a substance selected from the class consisting of dibutyl tin maleate, dibutyl tin diacetate, dibutyl tin alkyl phosphate, dibutyl tin dinaphthenate, dibutyl tin octoate, tetra butyl tin, ethyl silicate, thiodipropionitrile, triphenyl borate, propyl acid maleate, nopol acid maleate, dibutyl maleate, triphenyl phosphite, phenol, lead tartrate, tributyl-borate, ethyl methacrylate, lauryl methacrylate and crotonic acid and thereafter submitting said film to a temperature of about 250° F. to about 450° F. for about 1 to about 30 minutes to desensitize the unexposed areas.

2. The process of making photographic images which comprises selectively exposing a masked photo-sensitive film for at least 10 seconds to an actinic light source having an energy output of at least 120 milliwatts per square centimeter of exposed surface, said film consisting essentially of an intimate admixture of: (*a*) a substantially straight chain organic halogenated vinyl polymer resin, said resin capable of dehydrohalogenation with the formation of at least 5 conjugated double bonds; (*b*) a sequestering agent selected from the class consisting of silver carbonate, silver oxide, silver phosphate, silver naphthenate, silver acetate, silver cumate, silver octoate, silver compounds of phenols, silver compounds of mercaptans and the silver salt of 2 hydroxy 1, 4, naphthoquinone present in the amount to give silver to resin ratios of from about 1:500 to about 1:50; and (*c*) a substance selected from the class consisting of dibutyl tin maleate, dibutyl tin diacetate, dibutyl tin alkyl phosphate, dibutyl tin dinaphthenate, dibutyl tin octoate, tetra butyl tin, ethyl silicate, thiodipropionitrile, triphenyl borate, propyl acid maleate, nopol acid maleate, dibutyl maleate, triphenyl phosphite, phenol, lead tartrate, tributyl borate, ethyl methacrylate, lauryl methacrylate and crotonic acid present in the amount to give stabilizer to resin ratios of from about 1:500 to about 1:50, and thereafter submitting said film to a temperature of about 250° to about 450° F. for about 1 to about 30 minutes to de-sensitize the unexposed areas.

3. The process of making photographic images which comprises selectively exposing a masked photo-sensitive film for at least 10 seconds to an actinic light source having an energy output of at least 120 milliwatts per square centimeter of exposed surface, said film consisting essentially of an intimate admixture of: (*a*) a substantially straight chain organic halogenated vinyl polymer resin, said resin capable of dehydrohalogenation with the formation of at least 5 conjugated double bonds; (*b*) a sequestering agent selected from the class consisting of silver carbonate, silver oxide, silver phosphate, silver naphthenate, silver acetate, silver cumate, silver octoate, silver compounds of phenols, silver compounds of mercaptans and the silver salt of 2 hydroxy 1, 4, napthoquinone present in the amount to give silver to resin ratios of from about 1:500 to about 1:50; (*c*) a substance selected from the class consisting of dibutyl tin maleate, dibutyl tin diacetate, dibutyl tin alkyl phosphate, dibutyl tin dinaphthenate, dibutyl tin octoate, tetra butyl tin, ethyl silicate, thiodipropionitrile, triphenyl borate, propyl acid maleate, nopol acid maleate, dibutyl maleate, triphenyl phosphite, phenol, lead tartrate, tributyl borate, ethyl methacrylate, lauryl methacrylate and crotonic acid present in the amount to give stabilizer to resin ratios from about 1:500 to about 1:50; and (*d*) a substance selected from the class consisting of dioctyl phthalate, tricresyl phosphate, tributyl Cellosolve phosphate, triethylene glycol di, 2-ethyl hexoate and di, 2-ethylhexyl adipate present in the amount up to about 70 parts per 50 parts of resin, and thereafter submitting said film to a temperature of about 250° F. to about 450° F. for about 1 to about 30 minutes to desensitize the unexposed areas.

4. The process of making photographic images which comprises selectively exposing a masked photo-sensitive film for at least 10 seconds to an actinic light source having an energy output of at least 120 milliwatts per square centimeter of exposed surface, said film consisting essentially of an intimate admixture of: (*a*) a substantially straight chain organic halogenated vinyl polymer resin, said resin capable of dehydrohalogenation with the formation of at least 5 conjugated double bonds; (*b*) silver naphthenate; and (*c*) dibutyl tin dilaurate, and thereafter submitting said film to a temperature of about 250° F. to about 450° F. for about 1 to about 30 minutes to de-sensitize the unexposed areas.

5. The process of making photographic images which comprises selectively exposing a masked photo-sensitive film for at least 10 seconds to an actinic light source having an energy output of at least 120 milliwatts per square centimeter of exposed surface, said film consisting essentially of an intimate admixture of: (*a*) a substantially straight chain organic halogenated vinyl polymer resin, said resin capable of dehydrohalogenation with the formation of at least 5 conjugated double bonds; (*b*) silver cumate peptized with naphthenic acid; and (*c*) dibutyl tin dilaurate, and thereafter submitting said film to a temperature of about 250° F. to about 450° F. for about 1 to about 30 minutes to de-sensitize the unexposed areas.

6. The process of making photographic images which comprises selectively exposing a masked photo-sensitive film for at least 10 seconds to an actinic light source having an energy output of at least 120 milliwatts per square centimeter of exposed surface, said film consisting essentially of an intimate admixture of: (*a*) vinyl chloride-vinylidene chloride resin; (*b*) silver octoate peptized with octoic acid; and (*c*) dibutyl tin dilaurate, and thereafter submitting said film to a temperature of about 250° F. to about 450° F. for about 1 to about 30 minutes to de-sensitize the unexposed areas.

7. The process of making photographic images which comprises selectively exposing a masked photo-sensitive film for at least 10 seconds to an actinic light source having an energy output of at least 120 milliwatts per square centimeter of exposed surface, said film consisting essentially of an intimate admixture of: (*a*) a substantially straight chain organic halogenated vinyl polymer resin, said resin capable of dehydrohalogenation with the formation of at least 5 conjugated double bonds; (*b*) silver naphthenate; (*c*) dibutyl tin dilaurate; and (*d*) dioctyl phthalate, and thereafter submitting said film to a temperature of about 250° F. to about 450° F. for about 1 to about 30 minutes to de-sensitize the unexposed areas.

References Cited in the file of this patent

UNITED STATES PATENTS

| | | |
|---|---|---|
| 2,099,297 | Clement | Nov. 16, 1937 |
| 2,307,092 | Yngve | Jan. 5, 1943 |
| 2,431,078 | Powell et al. | Nov. 18, 1947 |
| 2,538,297 | De Nie | Jan. 16, 1951 |

FOREIGN PATENTS

| | | |
|---|---|---|
| 606,702 | Great Britain | Aug. 18, 1948 |